United States Patent
Nguyen (10) Patent No.: US 9,320,151 B2
(45) Date of Patent: Apr. 19, 2016

(54) PROTECTIVE SLEEVE FOR ELECTRICAL COMPONENTS

(71) Applicant: General Electric Corporation, Schenectady, NY (US)

(72) Inventor: Khanh Q. Nguyen, Lucas, TX (US)

(73) Assignee: General Electric Company, Schenectady, NY (US)

( * ) Notice: Subject to any disclaimer, the term of this patent is extended or adjusted under 35 U.S.C. 154(b) by 413 days.

(21) Appl. No.: 13/654,253

(22) Filed: Oct. 17, 2012

(65) Prior Publication Data

US 2013/0092417 A1    Apr. 18, 2013

Related U.S. Application Data (60) Provisional application No. 61/547,923, filed on Oct. 17, 2011.

(51) Int. Cl.
*H05K 3/30* (2006.01)
*H01L 23/32* (2006.01)
*H01L 23/495* (2006.01)

(52) U.S. Cl.
CPC .............. *H05K 3/306* (2013.01); *H01L 23/32* (2013.01); *H01L 23/49562* (2013.01); *H01L 2924/0002* (2013.01); *H05K 2201/10424* (2013.01)

(58) Field of Classification Search
CPC .......... H02B 1/56; H02B 13/025; H02B 1/00; H01F 27/40; H01H 9/52; B60L 15/007; H05K 3/32; H05K 3/306; H05K 3/308; H05K 2201/10424; H01L 23/32; H01L 23/49562; H01L 2924/0002; H01L 2924/00
USPC ............ 361/676–770; 439/70, 853, 856, 885, 439/587, 527, 625; 174/137 R, 138 R, 156, 174/167, 168, 176
See application file for complete search history.

(56) References Cited

U.S. PATENT DOCUMENTS

| | | | |
|---|---|---|---|
| 4,038,678 A * | 7/1977 | Gottbreht et al. | 257/734 |
| 5,147,209 A * | 9/1992 | Litwin et al. | 439/70 |
| 5,169,347 A | 12/1992 | Sang | |
| 5,397,254 A * | 3/1995 | Powell | 439/885 |
| 6,875,054 B2 | 4/2005 | Donaldson | |

* cited by examiner

Primary Examiner — Jenny L Wagner
Assistant Examiner — Pete Lee
(74) Attorney, Agent, or Firm — General Electric Company (57) ABSTRACT

A sleeve structure includes an electrically insulating protective sleeve having clips that retain and capture component pins and regulate a mounting distance of the electrical component from a wiring structure. A method of component wiring assembly is also included.

19 Claims, 11 Drawing Sheets

PROTECTIVE SLEEVE FOR ELECTRICAL COMPONENTS

CROSS-REFERENCE TO RELATED APPLICATION

This application claims the benefit of U.S. Provisional Application Ser. No. 61/547,923, filed by Khanh Nguyen on Oct. 17, 2011, entitled "Insulating Boot For Electrical Components", commonly assigned with this application and incorporated herein by reference.

TECHNICAL FIELD

This application is directed, in general, to protection of electrical components and their pins and wiring assembly.

BACKGROUND

Electrical devices such as integrated circuits, transistors, switchers, MEMs, optoelectronics, etc., have external protruding pins (or leads) that are soldered to or mounted on an electrical circuit board. These pins provide electrical connections to power and ground voltages and signals. If such pins are electrically short-circuited together, the device could fail or worse if the electrical currents are high, the entire circuit board could fail and cause catastrophic problems. In control rooms, computer racks, base stations, etc., the circuit boards, the devices and their pins are exposed to the environment and to blowing/circulating air to cool down the electronics. Dust, solder flux, shavings, metallic or chemical chips might blow and catch in between a pair of the device pins and over time cumulate and cause a short circuit. Alternatively, the pins may corrode due to moisture, chemicals and the elements. Consequently, it is beneficial to protect the pins and prevent solder flux and dust from being trapped near or between the pins. It is also beneficial to provide electrical insulation, support, improve mounting and manufacturability.

SUMMARY

Embodiments of the present disclosure provide protective sleeve structures and methods for component wiring assembly. For example, in one embodiment, there is a plurality of substantially planar shoulders, a plurality of boots, where each boot is located between and adjoined to a pair of substantially planar shoulders. Each boot includes two clips, a first clip having a first tapered surface, and a second clip having a second tapered surface. The two clips are separated by a gap, where a horizontal (major) plane of the gap is substantially perpendicular to the substantially planar shoulders. The first tapered surface faces the second tapered surface, separated by a gap distance.

In another aspect, there is a method of protecting electronic pins, including mating a protective sleeve with pins of an electrical component; catching the pins in the protective sleeve having boots, each having two tapered clips, with each tapered clip having a planar lower portion surrounding and retaining one pin; and insulating adjacent pairs of pins electrically using non-conductive substantially planar barriers between adjacent boots.

BRIEF DESCRIPTION OF EXEMPLARY DRAWINGS

Reference is now made to the following descriptions taken in conjunction with the accompanying drawings, in which.

DETAILED DESCRIPTION

Embodiments of the present disclosure provide a protective sleeve structure for pins or pins of electrical components. The sleeve protects and clips over the pins to prevent contaminants from collecting in and around each pin. The sleeve material is non-electrically-conductive or at least a relevant portion is non-conductive so that the sleeve is an electrical insulator that reduces the possibility of electrical arcing. Other features include a spacing so that the sleeve does not affect a soldering process, is retained on the component pins and thereby requires no fixturing, can withstand the solder process without deforming and is inexpensive and easy to employ.

Figure 1A:
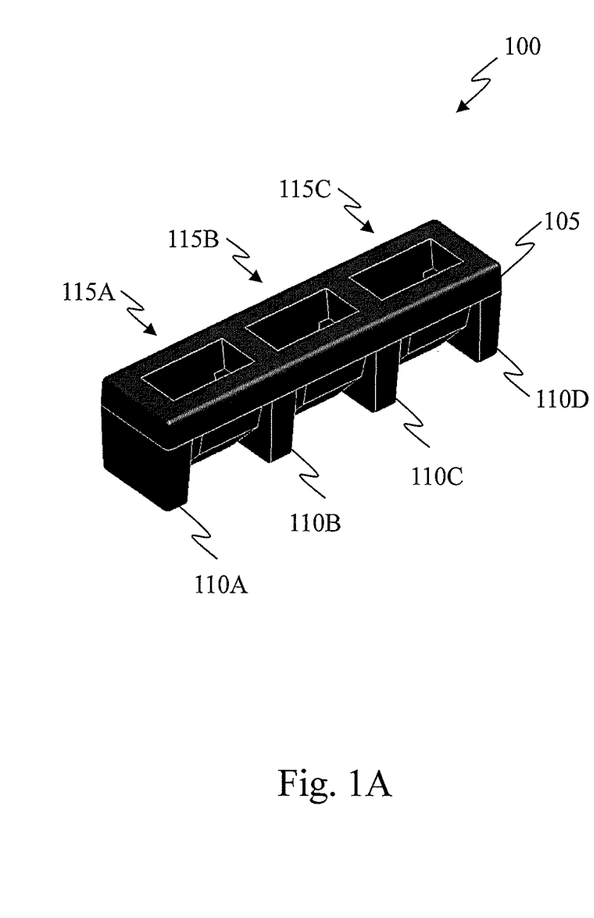
FIGS. 1A and 1B illustrate top and bottom perspective views, respectively, of an embodiment of a protective sleeve.
Figure 1B:
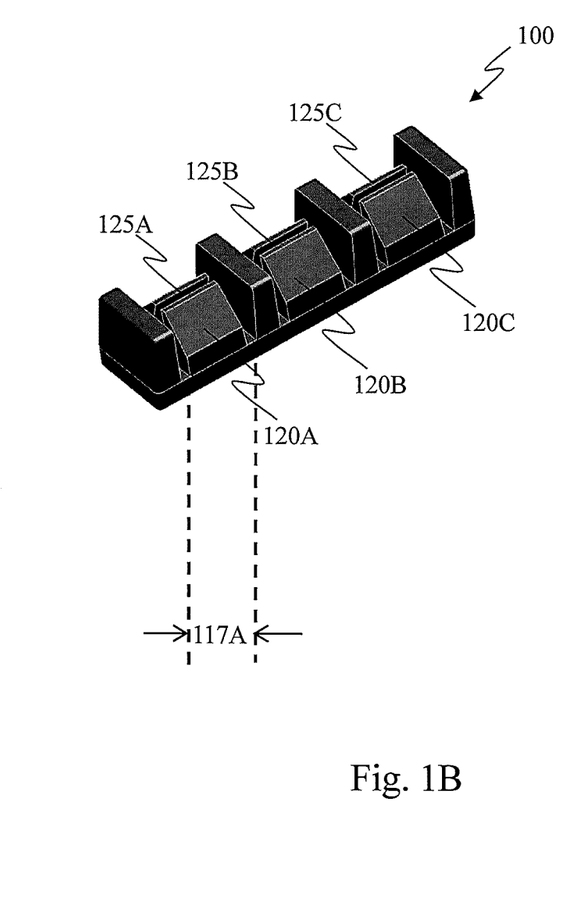

FIGS. 1A and 1B illustrate top and bottom perspective views of an embodiment of a protective sleeve, generally designated 100. The illustrated embodiment of the protective sleeve 100 accommodates an electrical component having a number of component pins (such as three) and employs retaining and spacing features for mounting the electrical component. The protective sleeve 100 includes a body portion 105, first, second, third and fourth separating shoulders 110A, 110B, 110C, 110D ("110A"). Between each pair of separating shoulders is a boot (e.g. 117A) that captures and retains the component pin and regulate the component pins' mounting distance 235 (e.g. FIG. 2) of the electrical component from a wiring structure such as a printed circuit board (PCB). Each boot 117A has two clips 120A and a slot or gap 115A between the two clips 120A. As depicted in FIG. 1B, there are first, second and third integral retaining clips 120A, 120B, 120C ("120A") having respective retaining gaps 125A, 125B, 125C ("125A"). In FIG. 1A, there are also first, second and third pin apertures 115A, 115B, 115C ("115A"). The pin aperture (e.g. 115A) in the top view of FIG. 1A extends the length of a clip 120A so that an aperture 115A of FIG. 1A becomes (or corresponds to) a gap 117A of FIG. 1B. FIGS. 2A and 2B depict how the aperture 115A corresponds to the gap 117A. In one embodiment, the boot 117A is an integral part of the body portion 105 and during manufacturing, the boot 117A and shoulders (e.g. 110A) are formed together in a mold as single object.

The protective sleeve 100 is utilized for connecting a device such as a TO-247 power electronics semiconductor package to the PCB. A device using a TO-247 package has three external pins (e.g. 310A, 310B, 310C in FIG. 3)) with each having a rectangular cross section. As depicted in FIG. 1A, the protective sleeve 100 has the three apertures 115A for facilitating acceptance of the three pins that feed into respective integral pairs of clips 120A that are shown in FIG. 1B. In alternative embodiments, the apertures 115A shown in the body portion 105 are chamfered to permit easy alignment and insertion of the electrical component pins into the protective sleeve 100. Or, the apertures 115A have an oval-shaped cross section or a rectangular cross section to permit easy pin access. The dimensions and shape of a cross-sectional area of electrical wires or pins on an IC chip or device are based on JEDEC or IEEE standards. Accordingly, the dimension of the aperture 115A is selected larger to be than a cross sectional area of pins. For example the gap width of the aperture 115A is larger than 40 to 50 mils.

The separating shoulders 110A function as legs and hold the electrical component away from the PCB thereby regulating its mounting distance 235. The separating shoulders 110A also provide a contamination barrier between the component pins, in particular, a barrier or wall between adjacent component pins so that solder dust and shavings would not collect between a pair of component pins. Further, because the separating shoulders 110A are made of electrically non-conductive material such as plastic and polymers, there is also electrical isolation of or insulation for each component pins. That is, adjacent component pins are electrically insulated from each other. Each boot 117A and pair of (retaining) clips 120A also further help to electrically isolate adjacent pins that are inserted into the apertures. The clips 120A are separated by a gap 125A in between the two clips 220A and 220B ("220A")(see FIGS. 2A and 2B). Each clip 220A is tapered and has a planar region near the lower end of the clip 220A. A major plane of the gap is perpendicular (90 degrees) relative to the separating shoulders 110A such that the clip 220A is also substantially perpendicular to the separating shoulders 110A. As such, the clips 220A performs a function similar to a flap that covers the pins, and protects and isolates each pin in a direction perpendicular to the plane of the separating shoulders 110. Moreover, in the example of FIG. 1, the separating shoulders 110A span the full width of the protective sleeve 100 to provide added mounting stability, and together with the boots 117A act as isolating barriers for any conductive contaminates that may accumulate around an electrical component lead and would otherwise cause a short or electrically conductive path among the electrical component pins. Alternatively, in other embodiments of FIG. 1, the separating shoulders 110A exists only on the ends of the protective sleeve 100, or there are fewer boots 117A spanning the full width of the protective sleeve 100.

The protective sleeve 100 is such that slot widths of the retaining gaps 125A are smaller than a corresponding thickness of electrical component pins (e.g., the TO-247 package pins) based on a JEDEC or IEEE standard. Either one side or both sides of the integral retaining clips 120A are also compliant with the standards for a cross sectional shape and dimensions of each electrical component pin in order to better capture and hold the pins in position. In addition, the spring-like feature enables the protective sleeve 100 to accommodate pins that have different thicknesses (or diameters). That is, the two clips 120A are made of plastic or polymers so that they are able to flex a certain distance depending on a thickness of the plastic or polymer. Moreover, the clips 120A (220A) are tapered so that there is less material near the lower end of the clip 120A, which increases the flexibility of the clip 120A. If the gap 125A width is smaller than a pin width, then the pair of clips 120A clamps snugly around the pin and prevents the pin from slipping through the pair of clips 120A. The integral retaining clips 120A are tapered at the end distal to the body portion 105 and proximate the retaining gaps 125A to facilitate flexibility, compliance and also permit improved inspection of a completed solder joint. For example, in the embodiment depicted in FIGS. 2A and 2B, at a lower end of the clips 120A, the tapering levels off so that there is a substantially planar section. Most electronic pins are flat or have a rectangular cross section (thus, the pin has a planar surface) according to JEDEC or IEEE specifications. A corresponding planar surface for the lower end of the clips 120A provides a better grip on the pins.

As indicated above, integral retaining clips 120A are also sometimes used with component pins having a circular cross section or a diamond-shaped cross section. In another embodiment, the retaining gaps 125A are modified to have a semi-circular slot in each side to accommodate circular cross-section pins. Other geometrical shapes may also be used on each side of the gap 125A, etc., to accommodate a cross sectional geometry of the component pins.

As an example of the plastic or polymer used, the protective sleeve 100 is fabricated of thermoplastic (e.g., VALOX 4205E0) using an injection molding process. Other additive materials or heat-treatment fabrication processes can also be employed so that the boot 117A is fabricated to desired dimensional tolerances, temperature specifications, and an ability to withstand heat treatments during a solder reflow process and so on.

Figure 2:
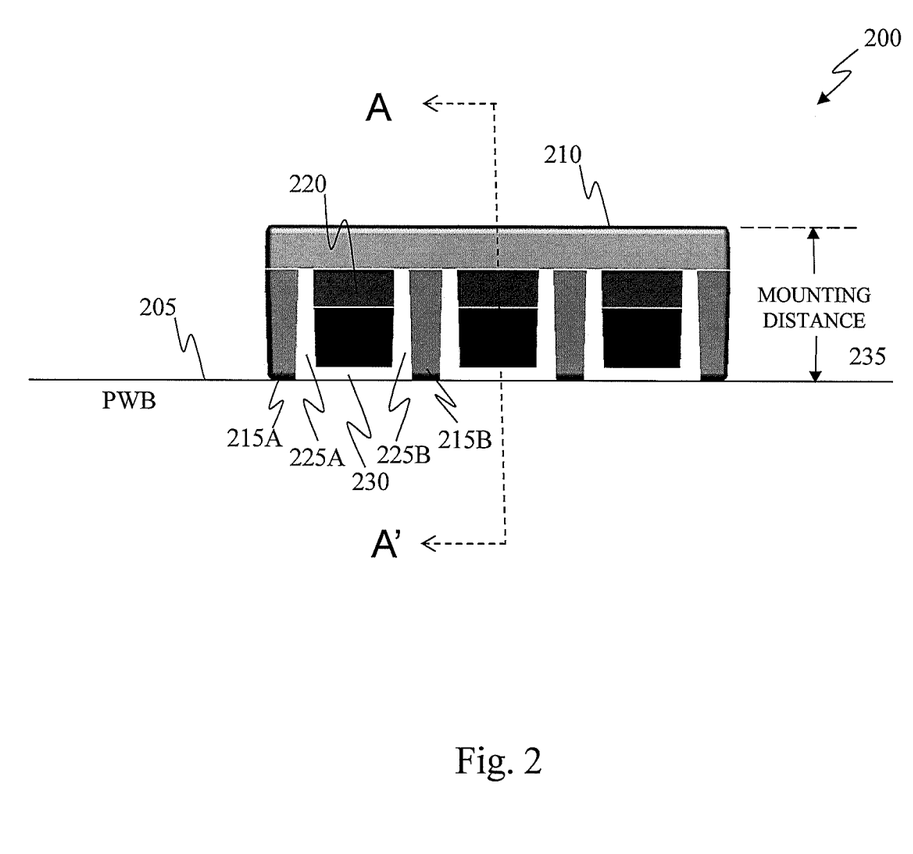
FIG. 2 illustrates a side view of the protective sleeve shown in FIGS. 1A and 1B.
Figure 2A:
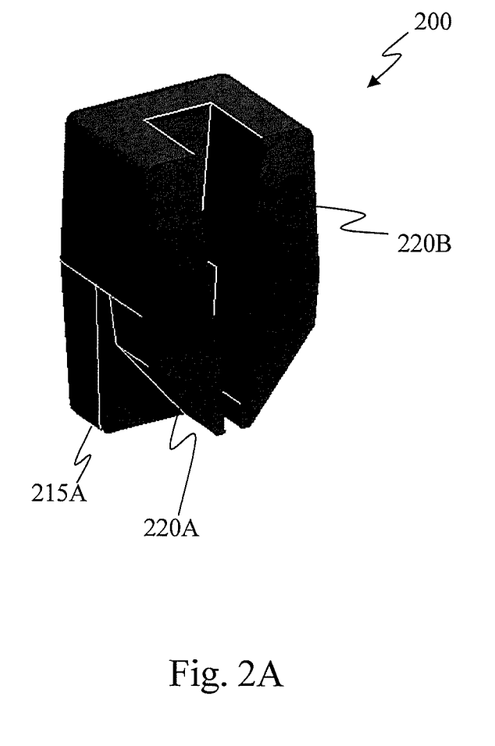
FIGS. 2A and 2B illustrate a perspective view and a cross sectional view, respectively, of the protective sleeve shown in FIG. 2, along the cut line or cross section line A-A'.
Figure 2B:
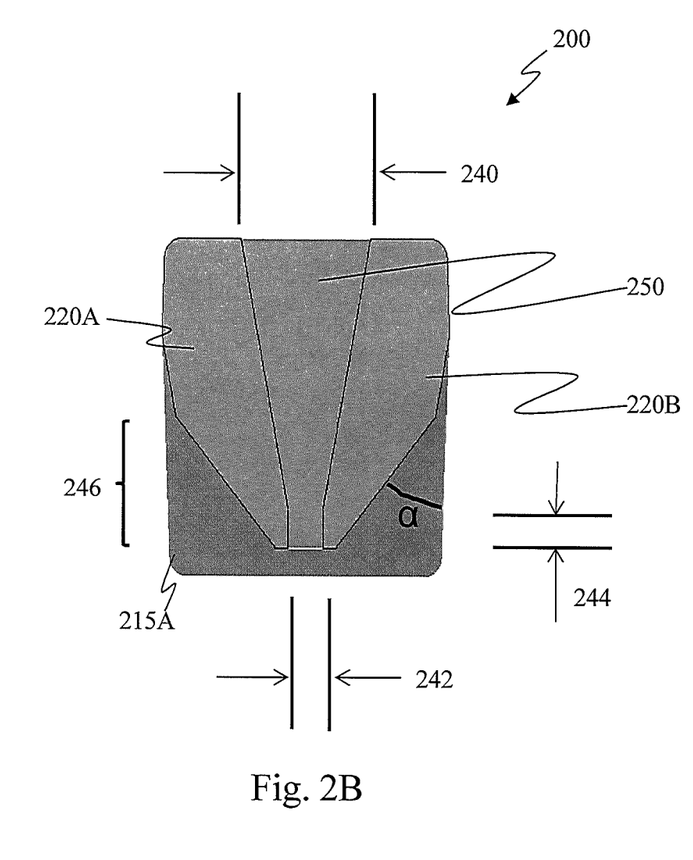

FIG. 2 illustrates a side view of a protective sleeve, generally designated 200, as may correspond to the protective sleeve 100 shown in FIGS. 1A and 1B. The protective sleeve 200 is shown contacting a mounting surface 205 of a wiring structure (e.g., a PCB). The length of the separating shoulders is the mounting distance 235 to give the clips 220 a clearance distance from the PCB. The protective sleeve 200 includes a body portion 210 and adjacent separating shoulders 215A, 215B that border the integral retaining clip 220 and provide cleaning spaces 225A, 225B and a solder fillet space 230.

The cleaning spaces 225A, 225B between the sides of the integral retaining clip 210 and the separating shoulders 215A, 215B permit any post assembly cleaning process to flush contaminants that may be present. Additionally, solder fillet space 230, corresponding to the distance between the bottoms of the adjacent separating shoulders 215A, 215B and the bottom of the integral retaining clip 220, enables solder to fill a mounting hole in the PCB and form a surface solder fillet on the PCB 205 around an electrical component lead.

FIGS. 2A and 2B illustrate a perspective view and a cross sectional view, respectively, of the protective sleeve shown in FIG. 2, along the cut line or cross section line A-A'. There are two clips 220A and 220B that are integral to the protective sleeve 200. FIGS. 2A and 2B also depict one of the separating shoulders 215A. The two clips 220A and 220B are separated by a gap 250, where a horizontal (major) plane of the gap is substantially perpendicular to the substantially planar shoulders 215A. Each clip 220A has an inner tapered surface that faces the tapered surface of the opposing clip 220B. The gap distance at near the top (240) is wider than at the bottom (242). For instance, the width at 240 is over 40 mils and the width at 242 is under 35 mils. The two clips comprises a tapered back side so that each clip 220A has a narrower cross sectional area at a bottom of the clip 220A than at a top of the clip 220A. A lower portion part of the backside is tapered by an angle α from the vertical. The angle α is optimized so that a width of the bottom portion of the clip 220A is thin enough to flex when a pin is inserted into the gap 250. There is also a planar region near the bottom of the clips 220A and 220B. In one embodiment, the planar length 244 is in the range of 15 to 25 mils, but is alternatively optimized based on the pin dimensions.

Figure 3:
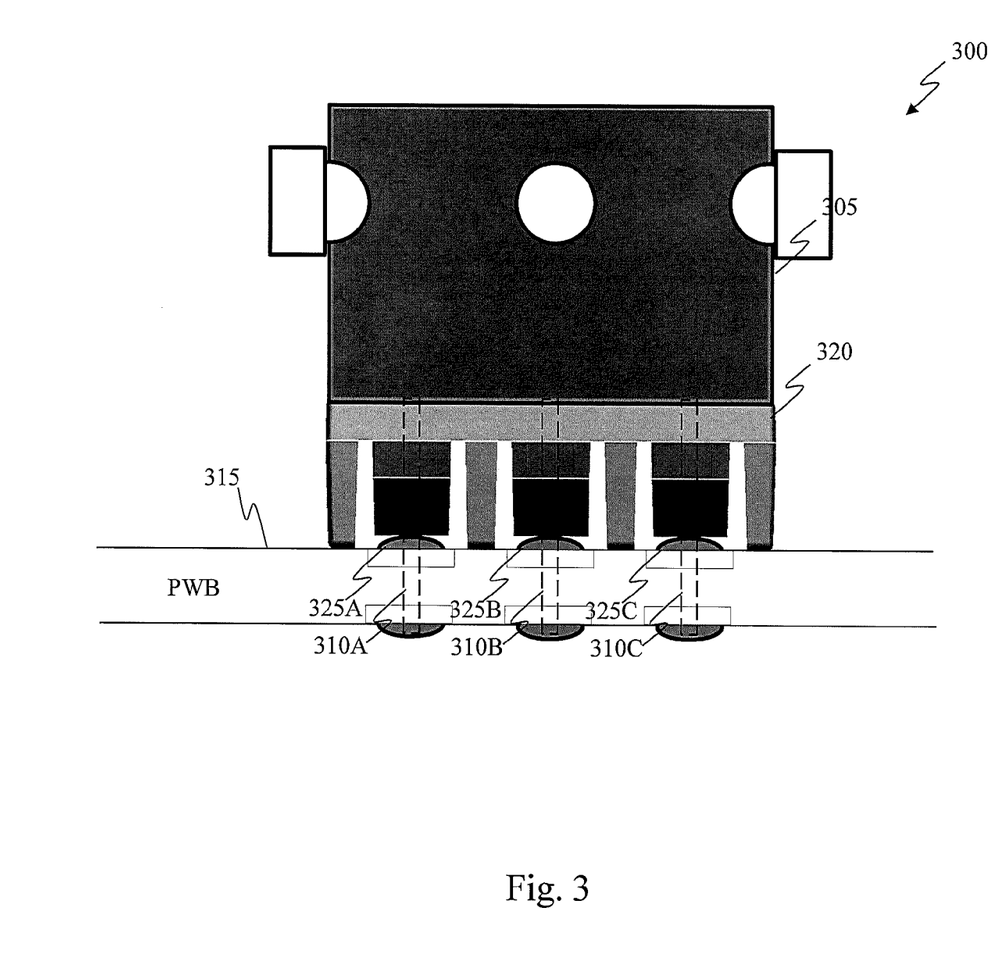
FIG. 3 illustrates a side view of an embodiment of a connection structure.

FIG. 3 illustrates a side view of an embodiment of a connection structure, generally designated 300. The connection structure 300 includes an electrical component 305 having three component pins 310A, 310B, 310C that are connected to a wiring structure such as a PCB 315 employing an protective sleeve 320. The connection structure 300 allows surface fillets 325A, 325B, 325C such as solder to form on the surface of the PCB 315.

Figure 4A:
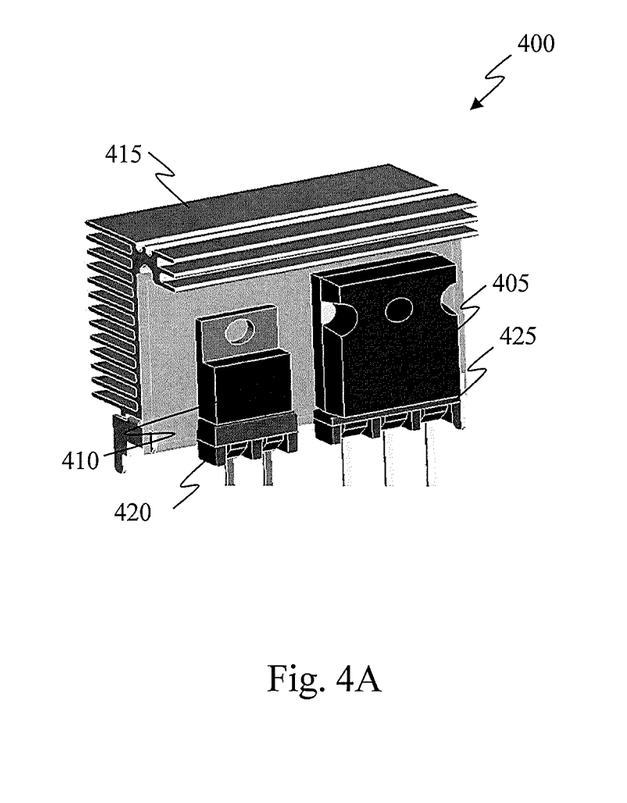
FIGS. 4A and 4B illustrate top and bottom perspective views of an embodiment of a heat sink assembly.
Figure 4B:
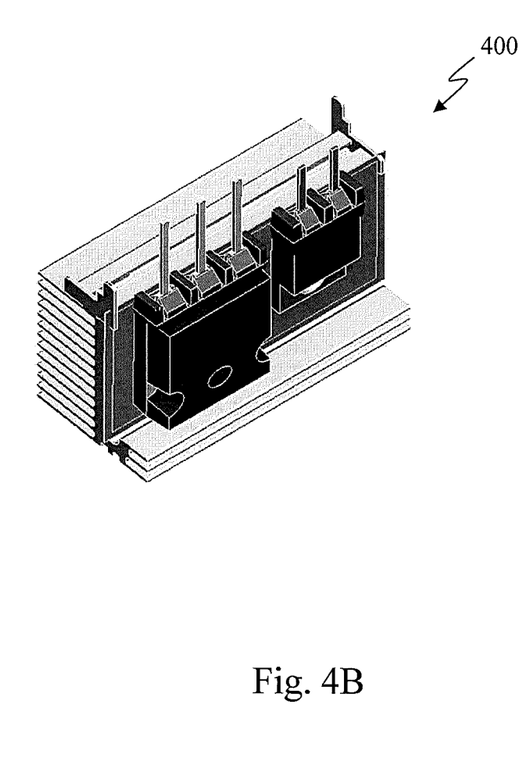

As examples of applications, FIGS. 4A and 4B illustrate top and bottom assembled views of an embodiment of a heat sink assembly, generally designated 400. The heat sink assembly 400 includes first and second semiconductor devices 405, 410 mounted on a common heat sink 415. The heat sink assembly 400 also includes first and second protective sleeves 420, 425 that are inserted over the pins of the respective first and second semiconductor devices 405, 410, (e.g., a TO-247 semiconductor package and a TO-220 semiconductor package). The first and second protective sleeves 420, 425 respectively accommodate these two and three pin electrical components.

The first and second protective sleeves 420, 425 fitted over their respective semiconductor pins as part of a heat sink assembly process. The first and second protective sleeves 420, 425 remain in the desired position because of the restraining clips previously described. The entire assembly can then be assembled onto a PCB without the need for additional processes or fixtures. Additionally, the first and second protective sleeves 420, 425 may be combined into a single protective sleeve.

Figure 5A:
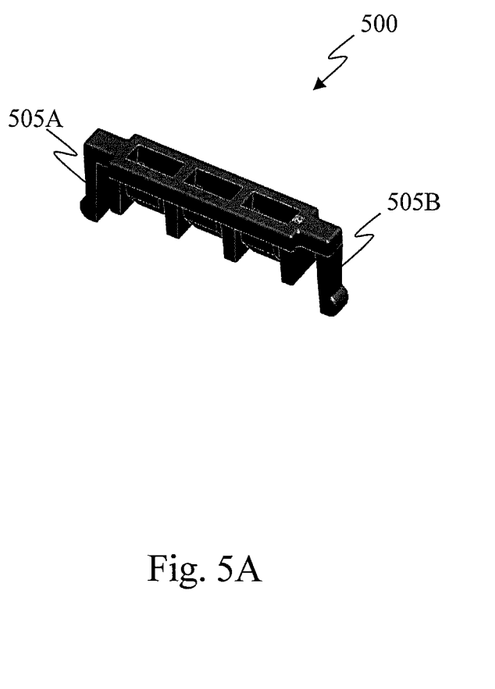
FIGS. 5A and 5B illustrate top and bottom perspective views, respectively, of an embodiment of the protective sleeve.
Figure 5B:
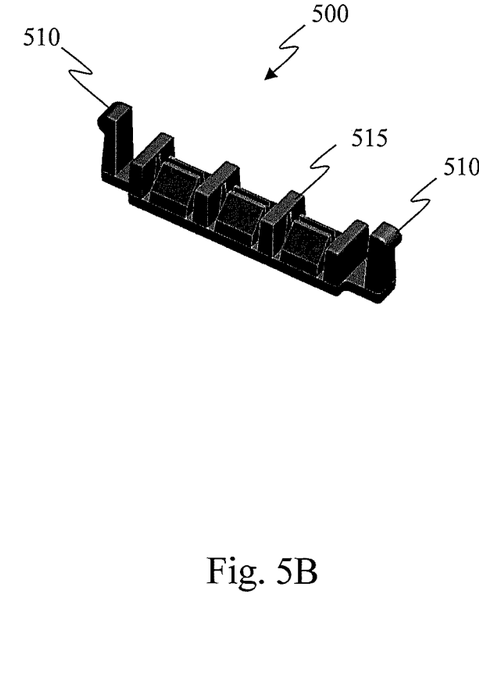

FIGS. 5A and 5B illustrate top and bottom perspective views of another embodiment of a protective sleeve, generally designated 500. The protective sleeve 500 includes additional mounting features 505A, 505B to aid in holding an electrical component in a desired orientation (e.g., to hold the electrical component in its desired orientation as it passes through a wave solder process).

Figure 6:
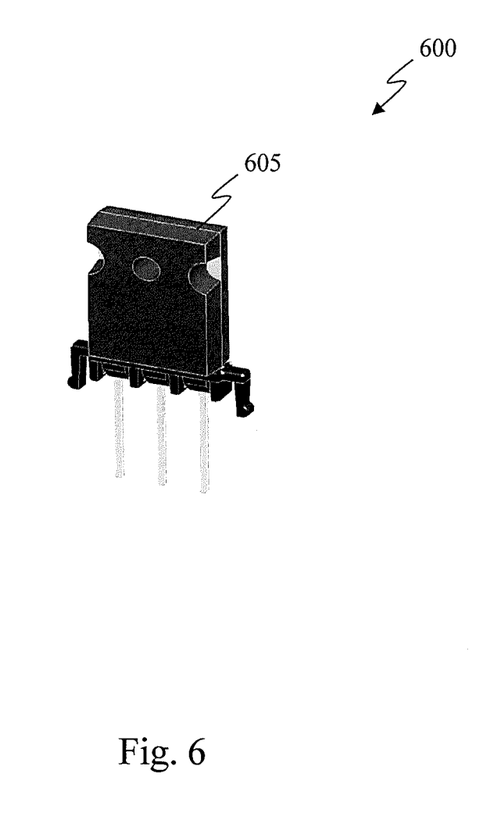
FIG. 6 provides an example of the protective sleeve of FIGS. 5A and 5B attached to an electrical component.

In this example, the mounting feature is a mounting leg 510 that extends beyond a row of separating shoulders 515 and has a capture feature (e.g. hook or notch) so that the protective sleeve 500 snaps into an appropriately sized mounting hole in a corresponding PCB. In this example, the length of the mounting leg 510 is such that the capture feature protrudes past the opposite side of the PCB. FIG. 6 provides an example of the protective sleeve 500 attached to an electrical component 605 and ready to mount to a PCB. The pins of component 605 are inserted into the protective sleeve 500. For instance, the electrical component 605 is a power management device.

Alternatively, the mounting feature is such that the mounting leg is circular in cross-section, and the mounting leg may or may not have a capture feature on its distal end. Or, it has a tapered, circular cross-section to allow an interference fit in a corresponding PCB mounting hole. Or, the mounting leg has a lengthwise split to provide a spring-like capture arrangement. Or, the mounting leg is an extension of the outer separating shoulders of the protective sleeve.

Figure 7A:
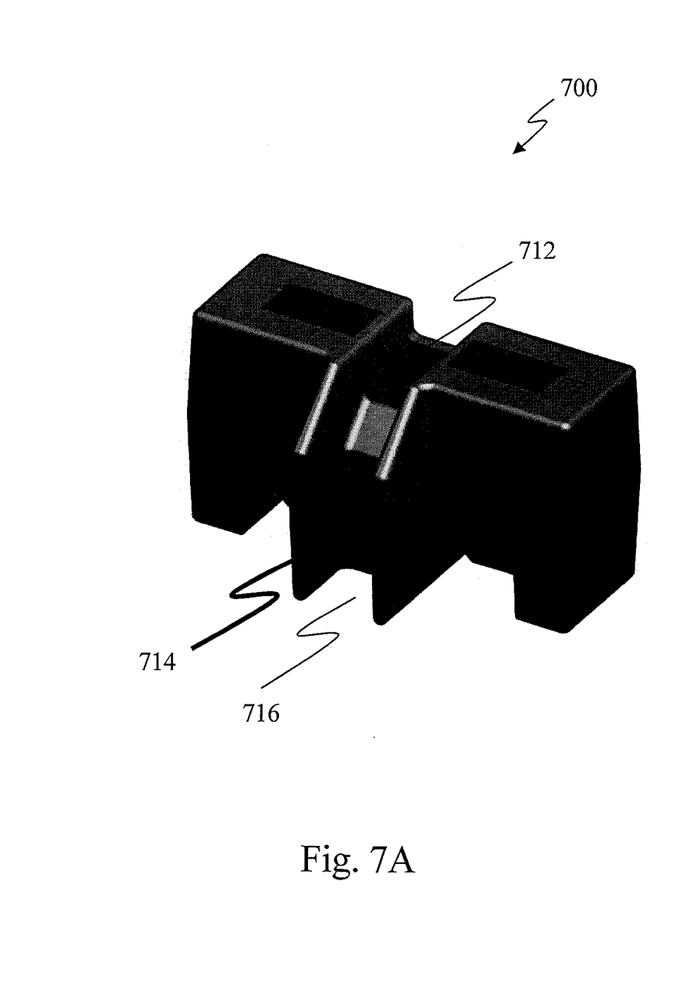
FIGS. 7A and 7B illustrate top and bottom perspective views, respectively, of another embodiment of a protective sleeve.
Figure 7B:
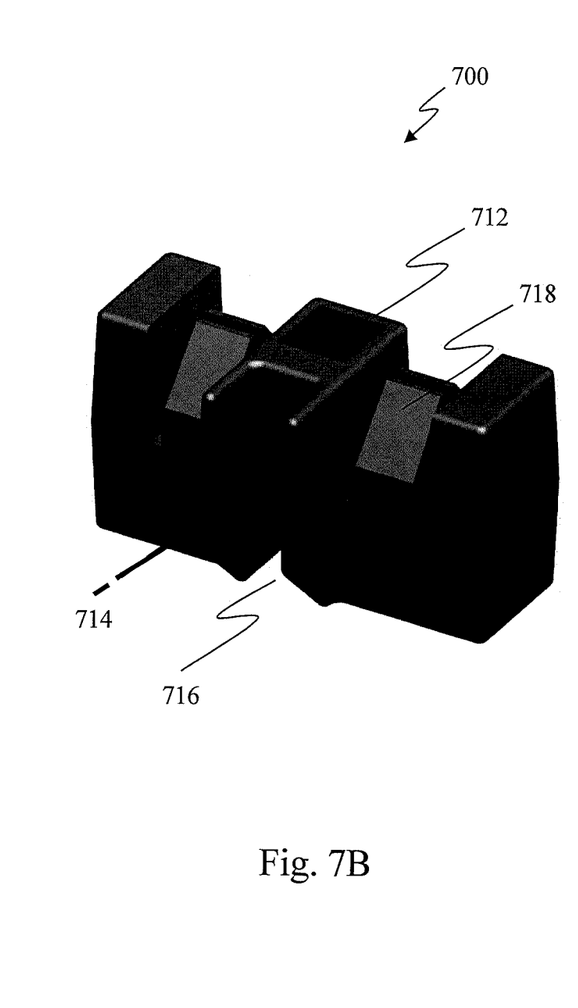

As examples of alternative embodiments of a protected sleeve 700, in FIGS. 7A and 7B, where the separating shoulders 110A extend out (e.g. protruding shoulders or walls 714) past a facial plane of the body portion 105. The facial plane spans a width of the body portion 105. The pair of protruding walls 714a has a beveled edge. The pair of protruding walls 714 also has a space 716 in between the shoulders 714. A width of the space 716 is larger than a width of external electrical pins for circuit devices, where the width is defined by standards such as the JEDEC or IEEE standards. The protruding shoulders 714 extend out and perform a function of blinders that electrically isolate the conductive or metallic pins. The protruding walls 714 and space 716, taken together, forms a divider between two boots 718.

Figure 8A:
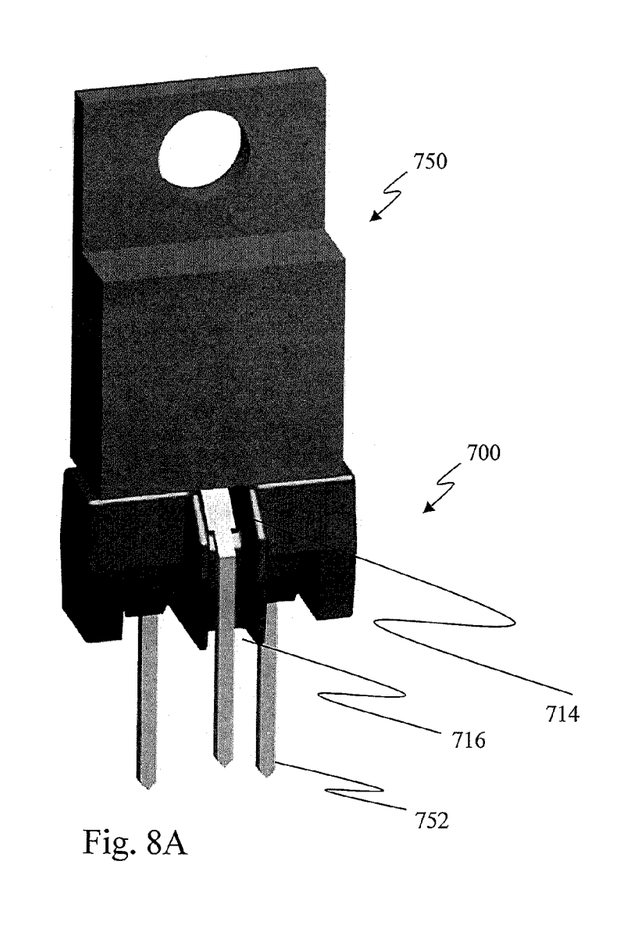
FIGS. 8A and 8B illustrate top and bottom perspective views, respectively, of one embodiment of a device mounted in the protective sleeve of FIGS. 7A and 7B.
Figure 8B:
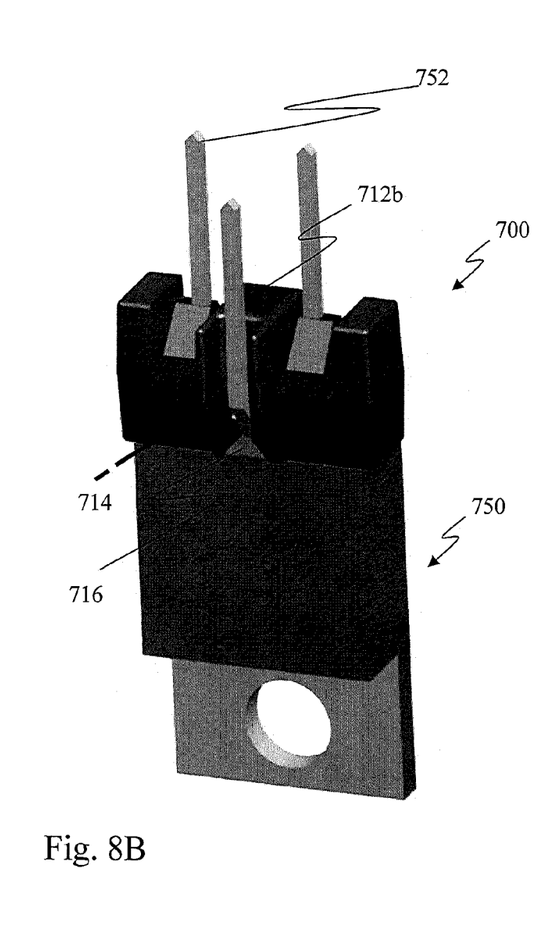

FIGS. 8A and 8B depict a top perspective view and bottom perspective view, respectively, of a packaged circuit device 750 with three external pins 752. The pins 752 are inserted into a protective sleeve 700. The middle external pin is not co-planar with the other two pins so that the middle pin is bent to conform to a contour of the surface behind the space 716. The contour is rhomboidal or has an angular bump, and the middle pin of the packaged circuit device 750 is also bent to follow the shape of the rhomboid or angular bump.

Alternatively, FIGS. 7A (top perspective view) and 7B (bottom perspective view) depict the protective sleeve 700 with an additional divider feature, an aperture 712 encased or surrounded by four walls. Protective sleeve 700 has two boots 718 and a divider between the two boots 718, wherein the divider includes the aperture 712 encased by four walls. As yet another alternative, the protective sleeve 700 has only one of the features, either the aperture feature 712 or the protruding wall 714 feature, but not both. Moreover, the combination of a protective sleeve 700 and a divider can be extended so that there are any number of boots 718 and dividers, and the sequential order of boots 718 and dividers is altered in other embodiments.

Figure 9A:
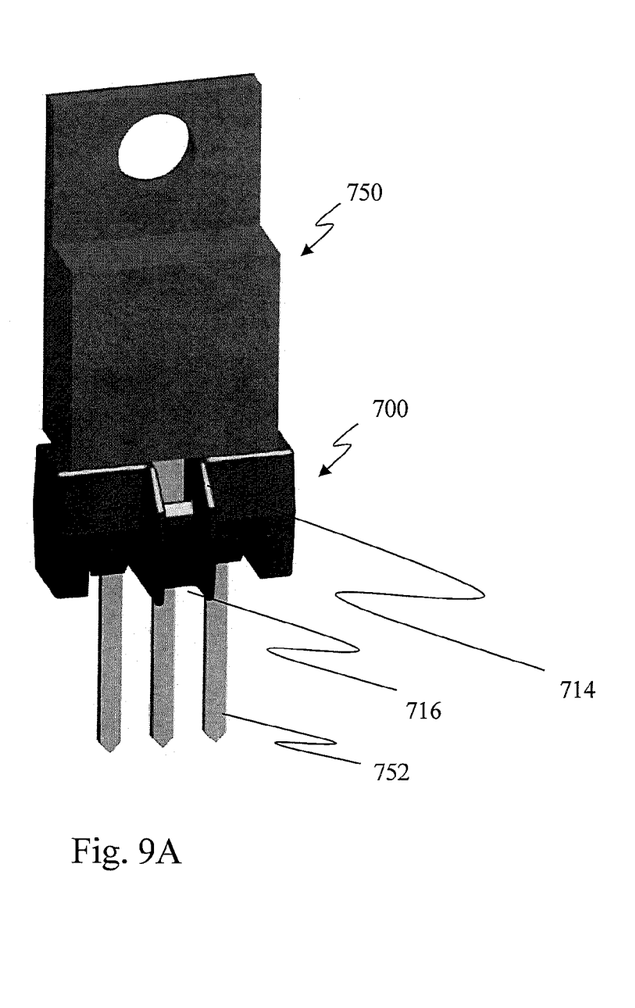
FIGS. 9A and 9B illustrate top and bottom perspective views, respectively, of one embodiment of another device mounted in the protective sleeve of FIGS. 7A and 7B.
Figure 9B:
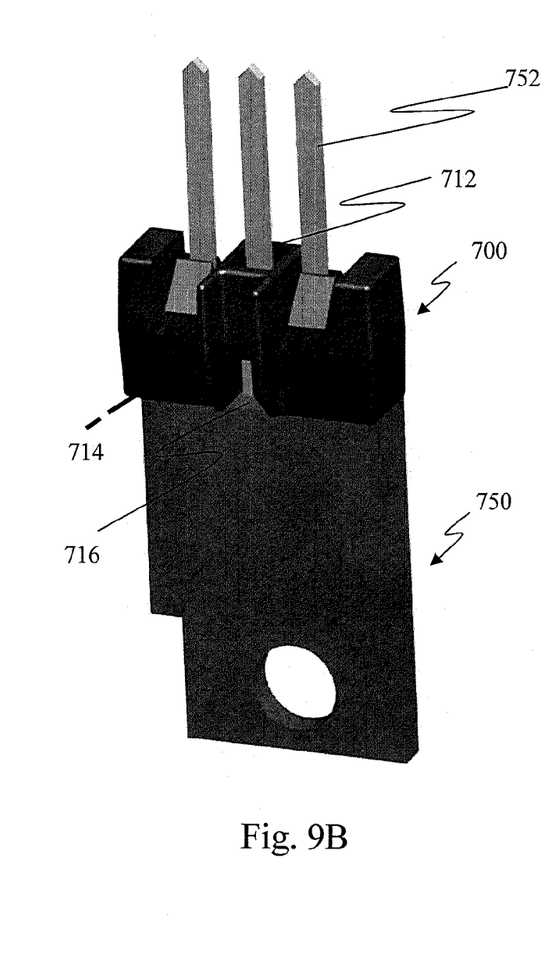

FIGS. 9A and 9B depict a top perspective view and bottom perspective view, respectively, of a packaged circuit device 750 with three external pins 753 that in different variations may or may not be aligned co-planarly. Even though the protective sleeve 700 is different in appearance from the protective sleeve 100, the pins 753 can still be inserted into the protective sleeve 700 because there is divider with an aperture 712. The middle one of the external pins 753 fits into the aperture 712.

Although the aforementioned embodiments of protective sleeves 100 are long contiguous strips, other arrangements for a protective sleeve 100 include a square or rectangular version having boots 117a along a border or periphery of the square or rectangle. Walls or barriers 110A are located between two boots 117a or interspersed among a few or several boots 117a. Such border type protective sleeves 100 are useful for daughter boards or small boards. For example, daughter boards have pins all along a border of the daughter board. The pins are pushed into the apertures 115A of the boots 117a. Then the daughter board is mounted or socketed on a larger board such as a computer motherboard.

Figure 10:
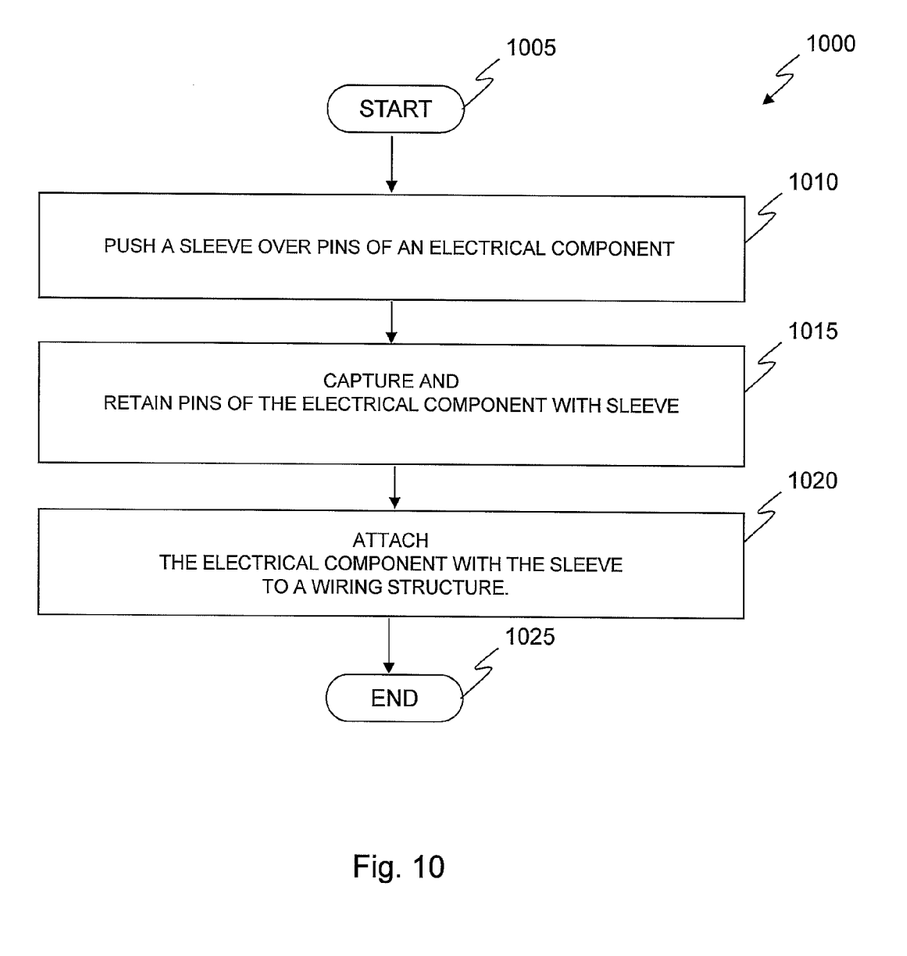
FIG. 10 illustrates a flow diagram of an embodiment of a method of component wiring assembly.

FIG. 10 illustrates a flow diagram of an embodiment of a method of component wiring assembly, generally designated 1000. The method 1000 starts in a procedure 1005. An electrical device is prepared so that its pins are to be inserted into the sleeve (e.g. 100, 700). For instance, a voltage regulator chip is mounted or placed on a heat sink pad on a PCB and the pins of the regulator chip are left exposed. Or the electrical device is on a tape and reel and loaded on an automated assembly equipment. An appropriately-sized sleeve 100 or 700 is selected to mate with the pins of the electrical device. Then, in a procedure 1010, sleeve 100 or 700 is pushed over the pins of the electrical device, for example, manually or automated by using a progressive assembly. Alternatively, the electrical device is pushed or inserted into the sleeve 100 or 700. For manual assembly, either alternative is possible; whereas for automated assembly, the particular equipment determines whether the sleeves 100 or 700 are stationary or if the electrical devices are stationary during the mating process. In procedure 1015, the pins of the electrical component are positioned deep enough in the sleeve 100 or 700 so that the retaining clips 220 capture the device pins and regulate the mounting distance 235. The device pins should be long enough to extend beyond the mounting distance 235. In procedure 1020, the electrical device with the protective sleeve is attached to the PCB or other wiring structure. For example, the attachment is performed by an introduction of solder or solder reflow on the PCB so that surface fillets, e.g. 325A, surround the device pins near the surface of the PCB as depicted in FIG. 3.

In one embodiment, the retaining and spacing features accommodate at least two component pins and include integral retaining clips that slip onto and hold the component pins in a required position. Additionally, the retaining and spacing features include apertures that guide the component pins into corresponding integral retaining clips. In another embodiment, the retaining and spacing features include separating shoulders that provide isolating barriers between the component pins. In yet another embodiment, the retaining and spacing features further include solder fillet gaps that are provided between distal ends of dividing shoulders and integral retaining clips. In still another embodiment, the retaining and spacing features further include cleaning gaps that are provided between corresponding sides of dividing shoulders and integral retaining clips.

In a further embodiment, the retaining and spacing features further include mounting legs that extend beyond the distal plane of dividing shoulders. In a yet further embodiment, the mounting legs have a capture feature that corresponds to a mounting hole in the wiring structure. In a still further embodiment, the capture feature protrudes past the wiring structure. The method 1000 ends in 1025.

While the method disclosed herein has been described and shown with reference to particular procedures performed in a particular order, it will be understood that these steps may be combined, subdivided, or reordered to form an equivalent method without departing from the teachings of the present disclosure. Accordingly, unless specifically indicated herein, the order or the grouping of the procedures is not a limitation of the present disclosure.

The embodiments of the protective sleeves discussed as well as other embodiments may be employed with other components besides those illustrated above. Such other components include capacitors, thermistors, sensors, MEMs, opto-electronics, etc., other leaded devices having two or more pins.

Those skilled in the art to which this application relates will appreciate that other and further additions, deletions, substitutions and modifications may be made to the described embodiments. For example, although reference is made to a printed circuit board. Flexible circuit boards or component surfaces should also benefit from these embodiments. The material used to form the sleeves may also be something other than polymer or plastic. As another example, although the drawings depict holes and shapes that are mostly rectangular, circular holes or clips having a circular aperture are also possible because some component pins have circular cross sections. Moreover, although words such as "top" and "bottom" are used in the foregoing descriptions, other spatial orientations are equivalent because, for example, a component board may be turned on its side or upside down.

What is claimed is:

1. A sleeve structure, comprising:
a plurality of substantially planar shoulders;
a plurality of boots, wherein each boot is located between and adjoined to a pair of substantially planar shoulders;
each boot comprises at least a first clip and a second clip, the first clip having an inner surface including a first tapered portion proximate a top of the first clip and a first flat portion proximate a bottom of the first clip, the second clip having an inner surface including a second tapered portion proximate a top of the second clip and a second flat portion proximate a bottom of the second clip, wherein said first clip and said second clip each comprise an electrically non-conductive material configured to contact an electronic pin;
a gap in between the two clips, wherein a major plane of the gap is substantially perpendicular to the substantially planar shoulders such that the major plane of the gap extends between adjacent substantially planar shoulders; and
a second gap between the first tapered portion and the second tapered portion, with the first tapered portion facing the second tapered portion.

2. The sleeve structure as recited in claim 1 wherein the second gap is narrower at lower ends of the two tapered portions, wherein the lower ends of the two tapered portions are substantially flat surfaces.

3. The sleeve structure as recited in claim 1 wherein a length of each the two clips is shorter than a length of the substantially planar shoulders so that the substantially planar shoulders comprise supporting legs of the sleeve structure.

4. The sleeve structure as recited in claim 1 wherein a top of the gap between the two clips defines an aperture having a width larger than 40 mils.

5. The sleeve structure as recited in claim 1 wherein the gap distance between the two tapered portions, near the bottom of the two tapered portions, is less than 35 mils.

6. The sleeve structure as recited in claim 2 wherein a length of the substantially flat surface is between 20 mils to 80 mils.

7. The sleeve structure of claim 1 comprises electrically insulating material or plastic or a polymer.

8. The sleeve structure as recited in claim 1 wherein each of the two clips comprises a tapered back side with each clip having a narrower cross sectional area at a bottom of the clip than at a top of the clip.

9. The sleeve structure as recited in claim 1 wherein an alignment of the plurality of boots is not co-planar.

10. The sleeve structure as recited in claim 1 wherein a divider is located between two adjacent boots, and the divider comprises two protruding walls, with a space between the protruding walls that is greater than the electronic pin width.

11. The sleeve structure as recited in claim 1 wherein a divider is located between two adjacent boots, and the divider comprises an aperture encased by four walls.

12. The sleeve structure of claim 1 comprises three boots or (two boots and a divider between the two boots), wherein the divider comprises an aperture encased by four walls.

13. A method of protecting electronic pins, comprising: mating a protective sleeve with pins of an electrical component; catching the pins in the protective sleeve having boots, each having two tapered clips, with each tapered clip having a planar lower portion surrounding and retaining one pin; and insulating adjacent pairs of pins electrically using non-conductive substantially planar barriers between adjacent boots; wherein the boots include a pair of integral boots located between a plurality of shoulder legs; each of the pair of integral boots having a first and second clip, the first clip having an inner surface including a first tapered portion proximate a top of the first clip and a first flat portion proximate a bottom of the first clip, the second clip having a second tapered portion proximate a top of the second clip and a second flat portion proximate a bottom of the second clip, wherein a first gap is defined between the first and second tapered portions and a second gap is defined between the first and second flat portion of the first and second clips, wherein an external pin of said external pins is configured for insertion into said first gap and wherein said first clip and said second clip each comprise an electrically non-conductive material configured to contact said pin.

14. The method as recited in claim 13 further comprising spacing a bottom tip of the tapered clips a distance above from a bottom of the substantially planar barriers.

15. The method as recited in claim 13 further comprising shielding the pins with the tapered clips; leaving a gap distance between the tapered clips narrow enough to retain a the pins; and maintaining a substantially 90 degree angle between the substantially planar barriers and a horizontal plane between the tapered clips.

16. The method as recited in claim 13 further comprising mounting the mated protective sleeve and pins on a component board; and leaving a space between the pins and a surface of the component board to place solder or adhesive material.

17. The method as recited in claim 13 wherein the mating comprises mating a three-pin electrical component with the protective sleeve.

18. A protection device, comprising:
  a power electronic device having a plurality of external pins; and
  an electrically insulating sleeve having: a plurality of shoulder legs; and
  a pair of integral boots located between the plurality of shoulder legs; each of the pair of integral boots having a first and second clip, the first clip having an inner surface including a first tapered portion proximate a top of the first clip and a first flat portion proximate a bottom of the first clip, the second clip having a second tapered portion proximate a top of the second clip and a second flat portion proximate a bottom of the second clip, wherein a first gap is defined between the first and second tapered portions and a second gap is defined between the first and second flat portion of the first and second clips, wherein an external pin of said external pins is configured for insertion into said first gap, and wherein said first clip and said second clip each comprise an electrically non-conductive material configured to contact said external pin.

19. The protection device as recited in claim 18 further comprising a divider with protruding walls and a space between the protruding walls.

\* \* \* \* \*